United States Patent [19]

Sittig

[11] Patent Number: 4,517,582

[45] Date of Patent: May 14, 1985

[54] ASYMMETRICAL THYRISTOR WITH HIGHLY DOPED ANODE BASE LAYER REGION FOR OPTIMIZED BLOCKING AND FORWARD VOLTAGES

[75] Inventor: Roland Sittig, Umiken, Switzerland

[73] Assignee: BBC Brown, Boveri & Company, Limited, Baden, Switzerland

[21] Appl. No.: 411,274

[22] Filed: Aug. 25, 1982

[30] Foreign Application Priority Data

Aug. 25, 1981 [CH] Switzerland ................. 5465/81

[51] Int. Cl.³ ............................................. H01L 29/74
[52] U.S. Cl. ..................................... 357/38; 357/13; 357/59; 357/89; 357/90
[58] Field of Search ................... 357/13, 59, 89, 90, 357/38

[56] References Cited

U.S. PATENT DOCUMENTS 3,538,401 11/1970 Chu ........................... 357/38
3,855,611 12/1974 Neilson et al. ............... 357/13
3,984,858 10/1976 Cornu et al. ................. 357/58

*Primary Examiner*—Joseph E. Clawson, Jr.
*Attorney, Agent, or Firm*—Oblon, Fisher, Spivak, McClelland & Maier

[57] ABSTRACT

A semiconductor component such as a four layer assymetrical thyristor having four zones of alternately opposite conductivity type, including a P emitter, an N base, a P base and an N emitter, wherein in the N base zone there is provided a stopping layer in a partial region adjacent the P emitter. The stopping layer has a doping concentration which decreases in a direction towards the P emitter zone perpendicular to the four zones. Thus the transport factor for the holes injected by the P emitter is desirably changed by means of lowering the doping concentration of the stopping layer in front of the P emitter, on the side of the anode, of a highly blocking thyristor in the forward direction, while the full effectiveness of the stopping layer remains unchanged. Also a lower blocking current in the blocking condition and/or a lower transmission voltage in the passing condition is attained.

1 Claim, 3 Drawing Figures

4,517,582

ASYMMETRICAL THYRISTOR WITH HIGHLY DOPED ANODE BASE LAYER REGION FOR OPTIMIZED BLOCKING AND FORWARD VOLTAGES

FIELD OF THE INVENTION

The invention concerns a semiconductor component, and more particularly to an assymetrical thyristor.

DESCRIPTION OF THE PRIOR ART

Such a semiconductor component is known, for example, from IEEE Transactions on Electron Devices, Vo. ED-23, No. 8 (1976) 823, and represents, in its simple design, an asymmetrical thyristor which has a higher blocking capability when forward biased than when reversed biased. With forward biasing a positive voltage is applied to the main electrode (anode) contacting the outer P-zone vis-a-vis the main electrode (cathode) contacting the outer N-zone. In practice, the asymmetrical thyristor is often designed as a reverse-conducting thyristor by means of the integration of an antiparallel diode. The high blocking capability of the known semiconductor component in the forward direction is due, in particular, to a doping excess in the partial area of the inner N-zone bordering on the outer P-zone. With an applied forward blocking voltage, a blocking layer develops at the PN-junction between the inner N and P zones which expand in these zones with a growing blocking voltage. The excessive doping in the partial area of the inner N-zone has particularly the task of stopping this expansion of the blocking layer and of, thus, preventing the so-called "punch-through" of the thyristor which occurs when the edge of the blocking layer reaches one of the adjacent outer and forward-biased PN-junctions, predominantly the one on the side of the anode, and stimulates it towards a charge carrier emission. The break-down of the thryistor is then only effected with a higher voltage by means of the so-called avalanche effect when the electrical field intensity exceeds a critical value in the blocking layer. In accordance with its function for stopping the expansion of the blocking layer, the excessively doped partial area of the inner N-zone is also identified as a stopping layer.

In order to optimize the blocking properties of the component, the stopping layer has to meet the following requirements:

its doping should be as high as possible in order to effectively stop the expansion of the blocking layer;

it should be sufficiently thick so that the transport factor is sufficiently reduced for the minority charge carriers injected from the P-zone on the side of the anode and, thus, no inadmissibly high share of the blocking current is caused.

In order to optimize the transmission properties and the connecting-through, after the ignition through the control electrode, the requirement is, however:

as low as possible a doping of the stopping layer as well as a low thickness of the stopping layer in order to reduce the forward voltage.

These contrasting requirements have been taken into account so far by means of a compromise which is not very satisfactory; on the one hand, by means of a mean constant doping degree in the stopping layer between $2·10^{16}$ cm$^{-3}$ and $1·10^{17}$ cm$^{-3}$; on the other hand, by means of a thickness of the stopping layer of about one and one half times to twice the diffusion length of the minority charge carrier.

Besides that, the introduction of an additional weakly doped zone is mentioned in the German Disclosure Publication No. 29 41 021 between the stopping layer and the outer P-zone in order to improve the emitter efficiency but the data indicated for the dimensioning of this zone is not defined in any real component.

SUMMARY OF THE INVENTION

Accordingly, the object of this invention is to improve, using technically simply means, the properties of the semiconductor component with respect to the requirements to be met by the stopping layer.

This and other objects are achieved according to the invention by providing a new and improved semiconductor device having a stopping layer wherein the doping concentration of the stopping layer drops from a higher ($C_{max}$) to a lower value ($C_{min}$) in a direction perpendicular to the layered zones of opposite conductivity type in which the lower value ($C_{min}$) is immediately adjacent the outer P-doped zone.

The special advantages of the invention result particularly from the lowering of the doping concentration of the stopping layer in front of the adjacent outer P-zone. In this way, the cutting-in behavior of the thryistor is improved and the transport factor is changed in the desired sense for the holes injected by the P-zone on the anode side between the operational conditions for blocking and passing:

blocking—low transport factor owing to the electrical field building up along the concentration gradient in the stopping layer.

passing—high transport factor since the entire stopping layer is flooded by free charge carriers and the electrical field does not occur any longer.

In this manner, it even becomes possible to reduce the thickness of the stopping layer whereby the forward voltage becomes lower in an advantageous fashion.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1:
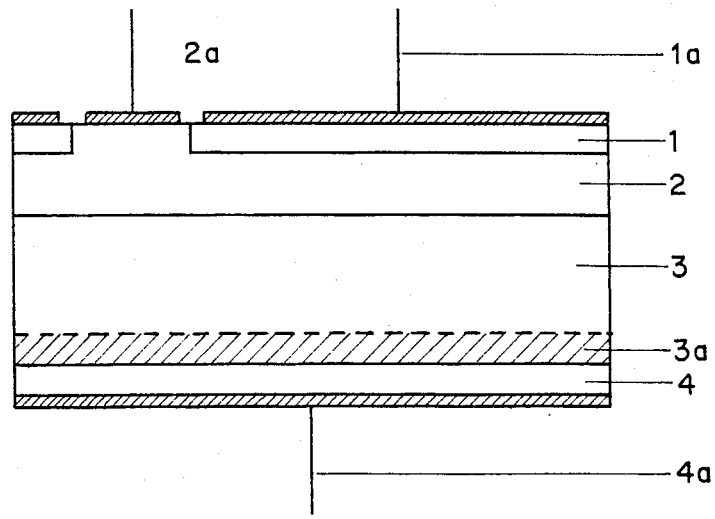
FIG. 1 is a cross-sectional view taken through the semiconductor component.

Referring now to the drawings, wherein like reference numerals designate identical or corresponding parts throughout the several views, and more particularly to FIG. 1 thereof, the semiconductor component consists, in its most simple design as an asymmetrical thyristor, of four zones of an alternatively opposite type of conductor, an N-zone 1 (N-emitter) on the side of the cathode, an inner P-zone 2 (P-base), an inner N-zone 3 (N-base) as well as a P-zone 4 (P-emitter) on the side of the anode. The shaded partial area 3a of the N-base 3 corresponds to the above mentioned stopping layer.

Figure 2:
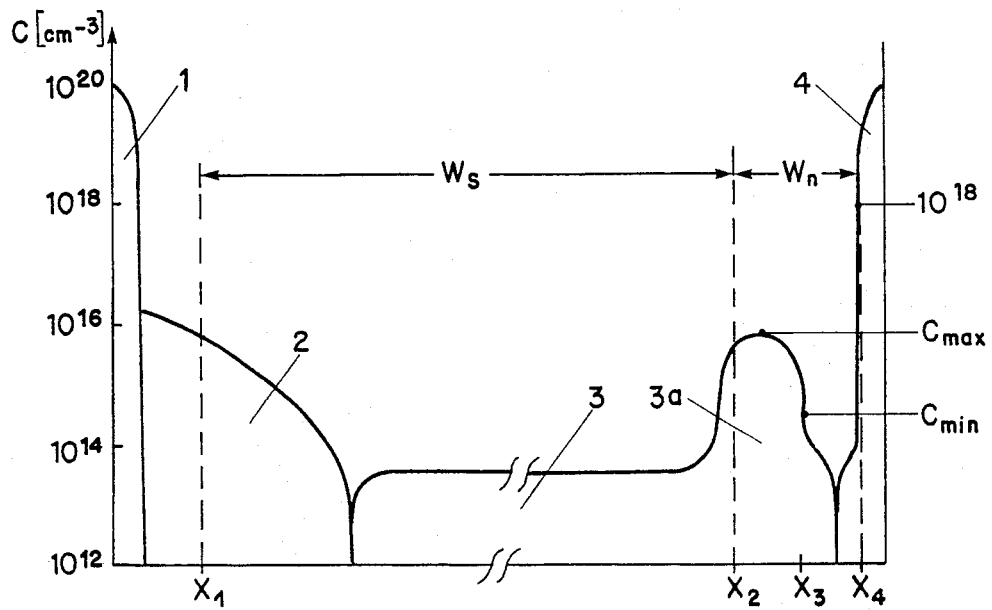
FIG. 2 is a graph illustrating the the doping profile of the semiconductor component in a diagram vertically to the layering of the zones.

The N-emitter 1 on the side of the cathode and the P-emitter 4 on the side of the anode are each in contact with respective main electrodes 1a and 4a and the P-base 2 with a control electrode 2a. In FIG. 2, the typical doping profile of the semiconductor component according to FIG. 1 is drawn in a diagram vertically to the layering of the zones as it can be produced approximately by means of known diffusion and epitaxial techniques. The doping excess can be recognized in the partial area 3a of the N-base 3, i.e. of the stopping layer, in comparison with the otherwise constantly low doping level C of the N-base 3. When a forward-bias voltage is applied to the main electrodes 1a and 4a, a blocking is effected by the PN-junction between the P-base 2 and the N-base 3 by the formation of a blocking layer which develops there. The two other PN-junctions are forward-biased in this case. With a growing blocking voltage, the blocking layer expands at the central PN-junction in the P-base 2 and in the N-base 3 whereby the expansion width is subject to the condition that the integral across the doping concentration C is of the same size from the PN-junction to the respective edge of the blocking layer on both sides of the junction. The width $W_S$ of the blocking layer is marked at a maximum blocking voltage by means of the boundary lines plotted into FIG. 2 at $X_1$ and $X_2$. As can be seen, the blocking layer extends across the entire weakly doped area of the N-base 3 but penetrates only little into the stopping layer 3a owing to the above mentioned integral condition.

Figure 3:
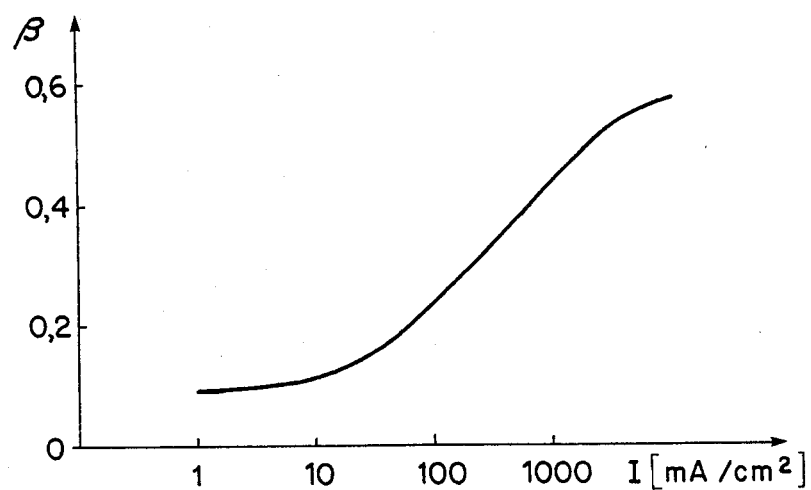
FIG. 3 is a graph illustrating the dependence of the transport factor $\beta$ on the current density in a diagram.

A suitable numerical value, which can be implemented for the maximum doping concentration $C_{max}$ of the stopping layer, is between $2 \cdot 10^{15}$ cm$^{-3}$ and $4 \cdot 10^{16}$ cm$^{-3}$, or even better between $4 \cdot 10^{15}$ cm$^{-3}$ and $1 \cdot 10^{16}$ cm$^{-3}$. The value $C_{min}$ to which the doping concentration C shall drop at least in the stopping layer 3a beyond the maximum $C_{max}$ of the P-emitter 4 on the side of the anode is calculated, in relation to $C_{max}$, in accordance with $\sqrt{5 \cdot 10^{12} \text{ cm}^{-3} \cdot C_{max}}$. The location at which the doping concentration C reaches the value $C_{min}$ in the stopping layer 3a is indicated in FIG. 2 by $X_3$. Besides the increase in the emitter efficiency, the doping decrease results in another advantage due to the fact that an electrical field is built up along the concentration gradient in the stopping layer 3a which acts against the minority charge carriers injected by the P-emitter 4 and restrains the transport of these minority charge carriers across the so-called neutral zone to the edge of the blocking layer at $X_2$. The neutral zone extends from the edge of the blocking layer at $X_2$ to the location $X_4$ at which the doping concentration C reaches the value $1 \cdot 10^{\sim}$ cm$^{-3}$ in the P-emitter 4. The electrical opposing field permits, in an advantageous manner, a reduction of the width $W_n$ of the neutral zone in order to reduce the forward voltage after the ignition of the thyristor without increasing simultaneously the blocking current in the blocking conditions. The electrical opposing field is the larger and the more effective, the steeper the concentration drop is to $C_{min}$ in front of $X_3$. As a measure for the steepness of this drop, a coefficient F can be defined at $X_3$ relative to the ideal border-line of the sudden change from $C_{max}$ to $C_{min}$ by means of $$F = \frac{\int_{X_2}^{X_3} C(X)dx}{C_{max} \cdot (X_3 - X_2)}$$

i.e. by means of the integral across the doping concentration C from the edge of the blocking layer at $X_2$ to the location $X_3$ which is standardized to the integral across a constant doping concentration on the level of $C_{max}$ between the same limits. The location $X_3$ is best located in the center of the neutral zone and should be, at any case, at a distance of more than 30 percent of its width $W_n$ from the edges at $X_2$ and $X_4$. For the width $W_n$ itself, a value is computed between $10^{-3}$ cm and $8 \cdot 10^{-3}$ cm but particularly an advantageous value according to $$W_n = \frac{0.6}{F} \frac{\tau_R}{\tau_G} \sqrt{\frac{10^{14} \text{cm}^{-3}}{C_{max}}} W_S$$

whereby $\tau_R$ represents the main recombination life span of the minority charge carriers in the stopping layer 3a, $\tau_G$ the mean generation life span of the minority charge carriers in the blocking layer having a width $W_S$ and F is the above defined coefficient. After the ignition of the thyristor through the control electrode 2a, the entire base zone 2, 3, including the stopping layer 3a, is flooded with charge carriers in such a high concentration that the concentration, lower by several orders of magnitude, of the charges, localized by the doping, in the stopping layer 3a is of no importance anymore in comparison with the free charges. In this way, the electrical opposing field is almost completely suppressed in the stopping layer 3a and no longer represents a perceivable resistance for the charge carrier transport. This means in other words that the transport factor $\beta$ becomes, in an advantageous way, a function of the current density for the minority charge carriers injected into the stopping layer 3a by the P-emitter up to the location $X_2$, i.e. the transport factor $\beta$ is low for a low current density in the blocking condition and high for a high current density in the passing condition. The functional dependence is shown in FIG. 3.

Obviously, numerous modifications and variations of the present invention are possible in light of the above teachings. It is therefore to be understood that within the scope of the appended claims, the invention may be practiced otherwise than as specifically described herein.

I claim:
1. An asymmetrical thyristor comprising:
at least four zones of alternately opposite conductivity type including a relatively high doped outer P emitter zone, a relatively lightly doped N base zone, a relatively lightly doped P base zone and a relatively highly doped N emitter zone layered one on top of the other, said P emitter and N emitter zones contacting respective main electrodes, and said N emitter zone having a recess through which said P base zone extends to contact a control electrode;
said N base zone having a partial region adjacent the P emitter zone, said partial region having a doping concentration (C) which is higher than that of remaining regions in the N base zone and which decreases from a higher value ($C_{max}$) to a lower value ($C_{min}$) in a direction towards the P emitter zone perpendicular to the four zones;
wherein with a predetermined maximum forward blocking voltage applied to the main electrodes there is formed a blocking layer in said N base zone and a neutral zone $W_n$ extending from the edge of the blocking layer in the N base zone into the P emitter zone to a location $X_4$ where the doping concentration of the P emitter zone reaches $1 \cdot X 10^{18}$ cm $^{-3}$;

said doping concentration (C) having the value $C_{min}$ at a location $X_3$ which is at least 30 percent of the width of the neutral zone $W_n$ away from the edge of the blocking layer; and the width of the neutral zone ($W_n$) being in the range between $1 \cdot 10^{-3}$ cm and $8 \cdot 10^{-3}$ cm and having a value which is calculated in accordance with $$W_n = \frac{0.6}{F} \frac{\tau_R}{\tau_G} \sqrt{\frac{10^{14} \text{cm}^{-3}}{C_{max}}} \cdot W_S$$

wherein $\tau_R$ refers to the mean recombination life span of the minority charge carriers in the partial region, $\tau_G$ refers to the mean generation life span of the minority charge carriers in the blocking layer having a width $W_S$ and F is defined by $$F = \frac{\int_{X_2}^{X_3} C(X) \, dx}{C_{max}(X_3 - X_2)}$$

which is the integral across the doping concentration (C) from the edge of the blocking layer in the inner N doped zone at $X_2$ to the location $X_3$ at which the doping concentration (C) reaches the value $C_{min}$ in the partial region and which is standardized to the integral across a constant doping concentration on the level of $C_{max}$ between the same limits.

* * * * *